(12) United States Patent
Suzuki

(10) Patent No.: US 9,685,302 B2
(45) Date of Patent: Jun. 20, 2017

(54) ELECTRON MICROSCOPE AND METHOD OF OPERATING SAME

(71) Applicant: JEOL Ltd., Tokyo (JP)

(72) Inventor: Takashi Suzuki, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/960,852

(22) Filed: Dec. 7, 2015

(65) Prior Publication Data
US 2016/0189924 A1    Jun. 30, 2016

(30) Foreign Application Priority Data

Dec. 8, 2014 (JP) .................................. 2014-248193

(51) Int. Cl.
*H01J 37/26* (2006.01)
*H01J 37/28* (2006.01)
*H01J 37/285* (2006.01)

(52) U.S. Cl.
CPC ............ *H01J 37/28* (2013.01); *H01J 37/285* (2013.01); *H01J 2237/24495* (2013.01); *H01J 2237/24507* (2013.01); *H01J 2237/2802* (2013.01)

(58) Field of Classification Search
CPC .. H01J 37/26; H01J 37/28; H01J 37/22; H01J 2237/2611; H01J 2237/2802
USPC .......................... 250/306, 307, 309, 310, 311
See application file for complete search history.

(56) References Cited

U.S. PATENT DOCUMENTS 6,555,830 B1 * 4/2003 Mankos ............... G01N 23/225
                                                      250/250
2013/0332116 A1 * 12/2013 Suzuki .................... G06F 17/18
                                                      702/191

FOREIGN PATENT DOCUMENTS

JP                5307942 A    11/1993

* cited by examiner

*Primary Examiner* — Nicole Ippolito
(74) *Attorney, Agent, or Firm* — The Webb Law Firm

(57) ABSTRACT

An electron microscope is offered that is capable of achieving noise cancellation which results in a low level of noise and which can be implemented at high speed. An electron microscope (1) associated with the present invention includes: an electron beam source (11) for producing an electron beam; a noise detector (4) for detecting a part of the beam to thereby produce a beam detection signal and dividing a dividend by the beam detection signal; at least one image signal detector (6) for detecting an image signal obtained by making the beam impinge on a sample (A); and an arithmetic section (60) for performing a multiplication between an output signal of the image signal detector (6) and an output signal of the noise detector (4).

6 Claims, 10 Drawing Sheets

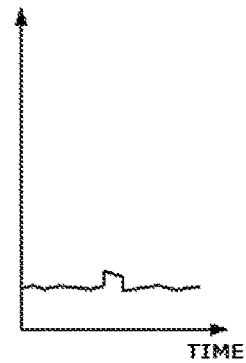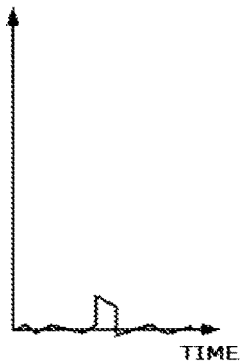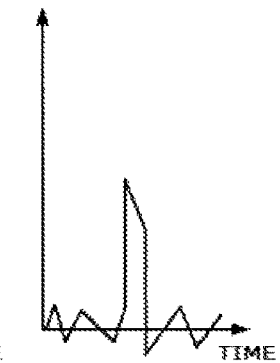
Fig.3(A)　　　Fig.3(B)　　　Fig.3(C)
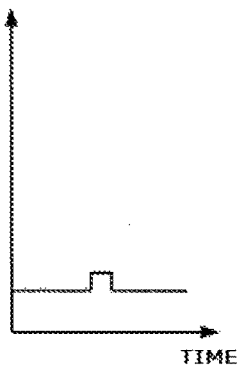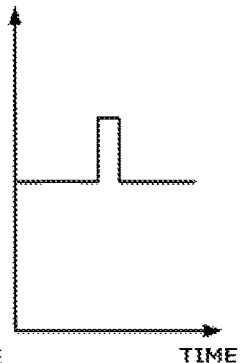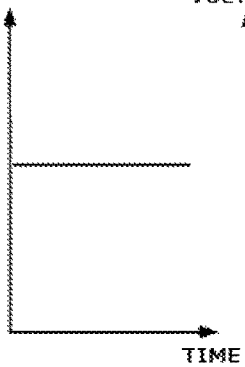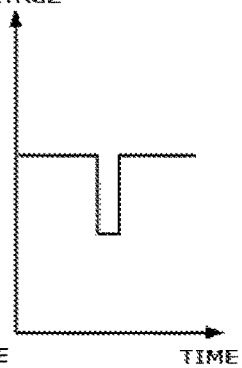
Fig.4(A)　　　Fig.4(B)　　　Fig.4(C)　　　Fig.4(D)

ELECTRON MICROSCOPE AND METHOD OF OPERATING SAME

BACKGROUND OF THE INVENTION

Field of the Invention

The present invention relates to an electron microscope and also to a method of operating it.

Description of Related Art

Generally, electrons emitted from a field-emission electron gun contain a varying portion of several percent for the following reason. Gases and ions are adsorbed onto the surface of the emitter and migrate, varying the work function of the metal surface. Also, collision of ions and so on varies the geometry of the metal surface. Therefore, where a field-emission electron gun is used in a scanning transmission electron microscope (STEM), a detector for noise cancellation is mounted in the electron optical column to detect nearby electrons that form a probe. The signal emitted from the sample is divided by the resulting detection signal, whereby emission noise on the image is eliminated. This noise canceling technique is disclosed, for example, in JP-A-5-307942.

FIG. 15 shows the configuration of a scanning transmission electron microscope (STEM) 101 having a general noise cancellation function. This electron microscope 101 of FIG. 15 has an electron optical column 110 in which various components including a cold field-emission electron gun (CFEG) 111, a noise canceling aperture 112, a lens 113a, scan coils 113b, another lens 114, a detector 115, a preamplifier circuit 120, and an amplifier circuit 130 are housed.

The electron beam emitted from the CFEG 111 is partially cut off by the noise canceling aperture 112 and then converged onto a sample A by the lens 113a. The converged beam is scanned over the sample A by the scan coils 113b. The electron beam transmitted through the sample A passes through the lens 114, and a part of the beam is detected by the detector 115.

An image signal detected by the detector 115 is the product of an emission current I1 impinging on the sample A and the brightness component S of the sample A, i.e., I1×S. The emission current I1 impinging on the sample A and the emission current I2 detected by the noise canceling aperture 112 have a proportional relationship, i.e., I1=n×I2. An offset is added to the image signal (I1×S) and the resulting signal is amplified by a factor of Gp by the preamplifier circuit 120. The amplified signal is further amplified by a factor of Ga by the amplifier circuit 130.

On the other hand, the emission current I2 detected by the noise canceling aperture 112 is amplified by a factor of Gn by a noise detection circuit 140. When the noise cancellation function is not used, the output signal of the amplifier circuit 130 bypasses a noise canceling circuit 150 and is arithmetically processed in a given manner by an arithmetic section (CPU) 160 and then sent to a personal computer (PC) 102. As a result, an STEM image of the sample A is displayed on a display unit for use with the PC 102.

When the noise cancellation function is used, the offset component added by the preamplifier circuit 120 is subtracted from the output signal of the amplifier circuit 130 by the noise canceling circuit 150. Then, the resulting signal is divided by the output signal of the noise detection circuit 140. Consequently, the emission noise contained in the image signal is removed. The image signal free of the emission noise is arithmetically processed in a given manner by the arithmetic section (CPU) 160 and sent to the personal computer (PC) 102. An STEM image of the sample A free of the emission noise is displayed on the display unit for use with the PC 102.

FIG. 16 shows a specific example of configuration of signal processing circuitry when the electron microscope 101 is in a mode of operation where the noise cancellation function is not used. As shown in this figure, when the noise cancellation function is not in use, STEM imaging is done fundamentally using only two adjustments, i.e., contrast and brightness. Contrast is a gain added to an image signal for adjusting the brightness. Brightness is a DC voltage applied to cancel out the offset component of the image signal. In the example of FIG. 16, with respect to the image signal S×I1 obtained from the detector 115 by adjusting the contrast, brightness B is added to the image signal S×I1 by an adder 122 in the preamplifier circuit 120 and then amplified by the factor of Gp by an amplifier 124. Therefore, the output signal $V_{11}$ of the amplifier 124 is given by $$V_{11} = Gp \times (S \times I1 + B) \quad (A)$$

The output signal $V_{11}$ of the amplifier 124 is amplified by the factor of Ga by an amplifier 132 in the amplifier circuit 130. Thus, from Eq. (A) above, the output signal $V_{12}$ of the amplifier 132 is given by $$V_{12} = Ga \times Gp \times (S \times I1 + B) \quad (B)$$

The output signal $V_{12}$ of the amplifier 132 is converted from analog to digital form by an analog to digital converter (ADC) 162 in the arithmetic section 160, then averaged or otherwise arithmetically processed, and sent to the PC 102 shown in FIG. 15.

On the other hand, FIG. 17 shows a specific example of configuration of signal processing circuitry when the electron microscope 101 is in a mode of operation where the noise cancellation function is used. As shown in this figure, also when the noise cancellation function is used, the output signal $V_{12}$ of the amplifier 132 is given by Eq. (B) above. In order to cancel out the brightness B added by the preamplifier circuit 120, an amplifier 151 of the noise canceling circuit 150 adds a gain equal to the product of the gain Gp of the amplifier 124 and the gain Ga of the amplifier 132 to the brightness B. A subtractor 152 subtracts the output of the amplifier 151 from the output signal $V_{12}$ of the amplifier 132. Accordingly, it is seen from Eq. (B) above that the output signal $V_{13}$ of the subtractor 152 is given by $$V_{13} = Ga \times Gp \times (S \times I1 + B) - Ga \times Gp \times B \quad (C)$$
$$= Ga \times Gp \times S \times I1$$

The emission current I2 detected by the noise canceling aperture 112 is converted into a voltage and amplified by the factor of Gn by an amplifier 142 in the noise detection circuit 140. Therefore, the output signal $V_{14}$ of the amplifier 142 is given by $$V_{14} = Gn \times I2 \quad (D)$$

The output signal $V_{13}$ of the subtractor 152 is applied to a numerator input (X) of a divider circuit 154. The output signal $V_{14}$ of the amplifier 142 is applied to a denominator input (Y) of the divider circuit 154. Accordingly, from Eqs. (C) and (D), the output signal $V_{15}$ of the divider circuit 154 is given by $$V_{15} = \frac{X}{Y} = \frac{V_{13}}{V_{14}} = \frac{Ga \times Gp \times S \times I1}{Gn \times I2} \quad (E)$$

In the noise canceling circuit 150, in order to subtract the output signal of the amplifier 151 from the output signal $V_{12}$ of the amplifier 132 by the subtractor 152, an amplifier 155 adds a gain equal to the product of the gain Gp of the amplifier 124 and the gain Ga of the amplifier 132 to the brightness B. An adder 156 adds the output of the amplifier 155 to the output signal $V_{15}$ of the divider circuit 154. Therefore, the output signal $V_{16}$ of the adder 156 is given by $$V_{16} = \frac{Ga \times Gp \times S \times I1}{Gn \times I2} + Ga \times Gp \times B \quad (F)$$
$$= S \times \frac{Ga \times Gp}{Gn} \times \frac{I1}{I2} + Ga \times Gp \times B$$

The output signal $V_{16}$ of the adder 156 is converted from analog to digital form by the analog to digital converter 162 in the arithmetic section 160, then averaged or otherwise arithmetically processed, and sent to the PC 102 shown in FIG. 15.

Substituting the equation, I1=n×I2, into Eq. (F) results in $$V_{16} = S \times \frac{Ga \times Gp}{Gn} \times n + Ga \times Gp \times B \quad (G)$$

Note that none of the emission currents I1 and I2 containing emission noise are present in the right side of Eq. (G). Consequently, when the noise cancellation function is used, a value proportional to the brightness component S of the sample S to be imaged and observed is obtained in the same way as when there is no emission noise.

In the example of FIG. 17, operations for removing and re-adding brightness and a division operation are performed by analog circuitry. Alternatively, these operations may be carried out by digital arithmetic operations. In this case, measurement and setting of the gain of brightness that is removed and re-added and other adjustments can be made automatically.

The related art noise canceling method described so far has the following problems.

First, where the division is performed with an analog circuit (herein referred to as the analog division method), it is necessary to constitute log (logarithm) circuits and an antilog circuit. FIG. 18 shows one example of configuration of the divider circuit 154 using log circuits 154a, 154b and an antilog circuit 154c. As shown in FIG. 18, the divider circuit 154 performs a division using analog signals by performing a logarithmic conversion by the log circuits 154a, 154b, then subtracting the output signal of the log circuit 154b from the output signal of the log circuit 154a, and performing a logarithmic conversion of the resulting difference by the antilog circuit 154c.

In the analog division method, it is necessary to constitute the log circuits 154a, 154b and antilog circuit 154c operating in a frequency bandwidth of several MHz corresponding to the speed at which the image signal is detected and so the amount of noise component increases steeply. However, this frequency bandwidth is required for signals of STEM images and, therefore, it is difficult to limit the bandwidth subsequently. The antilog circuit 154c has a high gain, and it is difficult to broaden the frequency bandwidth due to the effects of noise.

On the other hand, where divisions are performed by digital computations (herein referred to as the digital division method), divisions are slower to perform than other types of calculations. As a result, the frequency bandwidth is narrowed.

SUMMARY OF THE INVENTION

The present invention has been made in view of the foregoing problems. One object associated with some aspects of the present invention is to provide an electron microscope capable of implementing a noise cancellation process which achieves a low level of noise and which can be operated at high speed. Another object is to provide a method of operating this electron microscope.

(1) An electron microscope associated with the present invention comprises: an electron beam source for producing an electron beam; a noise detector for detecting a part of the electron beam to thereby produce a beam detection signal and dividing a dividend by the beam detection signal; at least one image signal detector for detecting an image signal obtained by making the electron beam impinge on a sample; and an arithmetic section for performing a multiplication between an output signal of the image signal detector and an output signal of the noise detector.

In this electron microscope, the dividend is divided by the beam detection signal in the noise detector. The image signal is detected by the image signal detector. The arithmetic section performs a multiplication between the output signal of the noise detector and the output signal of the image signal detector. Consequently, the image signal neither passes through any divider circuit nor undergoes a division operation relying on digital computations. This makes it unnecessary for the noise detector to constitute a divider circuit having a frequency bandwidth, for example, corresponding to the speed at which an image signal is detected. Hence, noise can be suppressed. Furthermore, the image signal detector can be made higher in operation without being limited by the speed at which a division operation is performed. Thus, this electron microscope can achieve a noise cancellation process which results in a low level of noise and which can be implemented at high speed.

(2) In one feature of this electron microscope, the arithmetic section may perform the multiplication by a digital arithmetic operation.

This electron microscope can achieve a noise cancellation process which results in a low level of noise and which can be implemented at high speed.

(3) In another feature of this electron microscope, the noise detector may include a divider circuit that divides the dividend by the beam detection signal in an analog manner.

In this electron microscope, the image signal does not pass through any divider circuit. This makes it unnecessary to constitute a divider circuit having a frequency bandwidth corresponding to the speed at which the image signal is detected. Therefore, low-noise parts having a narrow frequency bandwidth, for example, can be used to form the divider circuit. Moreover, a filter having a narrow bandwidth, for example, for suppressing noise generated from the divider circuit can be inserted. Thus, this electron microscope can achieve a noise cancellation process which results in a still lower level of noise.

(4) In a further feature of this electron microscope, the dividend may be an effective value of the beam detection signal.

With this electron microscope, images can be observed without regard to the manner in which the emission current decreases with time. Therefore, with this electron microscope, if a cold cathode field-emission electron gun is used as an electron beam source, images free of emission noise can be observed by performing operations similar to operations done when a Schottky emission gun is used.

(5) In an additional feature of this electron microscope, the at least one image signal detector may be plural in number. The arithmetic section may perform multiplications between output signals of the plural image signal detectors and the output signal of the noise detector.

In this electron microscope, divisions are performed in the noise detectors. In the arithmetic section, multiplication operations are performed without performing division operations. Therefore, in the arithmetic section, the load incurred in arithmetically processing the output signals of the image signal detectors can be reduced, for example, as compared with the case where a division operation is performed on each of the output signals of the image signal detectors. Consequently, if this electron microscope has plural image signal detectors, the processing load on the arithmetic section can be reduced. When the output values from the plural image signal detectors are entered, they can be arithmetically processed in parallel and simultaneously.

(6) A method of operating an electron microscope in accordance with the present invention comprises the steps of: detecting a part of an electron beam generated by an electron beam source to thereby produce a beam detection signal and dividing a dividend by the beam detection signal (may also be referred to as the noise detecting step); making the electron beam impinge on a sample to produce an image signal and detecting the image signal (may also be referred to as the image signal detecting step); and performing a multiplication between an output signal produced from the image signal detecting step and an output signal produced from the noise detecting step (may also be referred to as the computing step).

In this method of operating an electron microscope, during the noise detecting step, the dividend is divided by the beam detection signal. During the image signal detecting step, the image signal is detected. During the computing step, a multiplication between the output signal produced from the noise detecting step and the output signal produced from the image signal detecting step is performed. As a result, the image signal neither passes through any divider circuit nor undergoes a division operation relying on digital computations. Consequently, in this method of operating an electron microscope, a noise cancellation process which results in a low level of noise and which can be performed at high speed can be accomplished.

BRIEF DESCRIPTION OF THE DRAWINGS

FIGS. 3A-3C are waveform diagrams of signals appearing at nodes of an image signal detector included in the microscope shown in FIG. 1.

FIGS. 4A-4D are waveform diagrams of signals appearing at nodes of a noise detector included in the microscope shown in FIG. 1.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. First Embodiment 1.1. Electron Microscope

Figure 1:
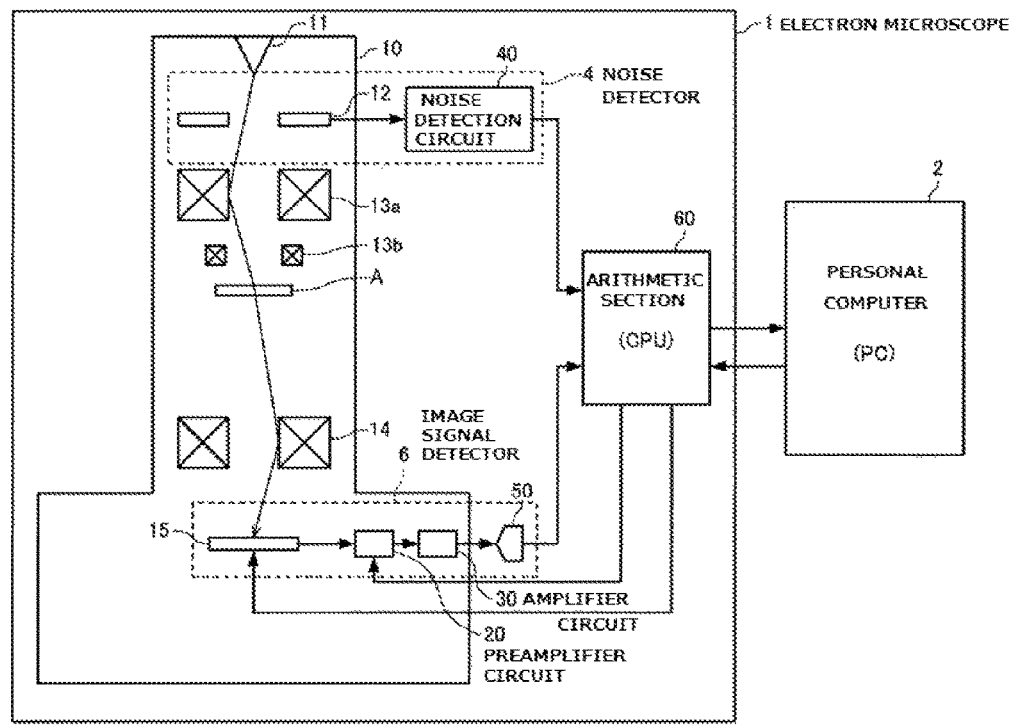
FIG. 1 is a block diagram of an electron microscope associated with a first embodiment of the present invention.

An electron microscope associated with a first embodiment of the present invention is first described by referring to FIG. 1, which shows one example of configuration of the electron microscope, 1.

As shown in FIG. 1, the electron microscope 1 is configured including an electron optical column 10, a noise detection circuit 40, an A/D converter 50, and an arithmetic section (CPU) 60. Housed in the electron optical column 10 are an electron beam source 11, a noise canceling aperture 12, an illumination lens system 13a, scan coils 13b, an imaging lens system 14, an image detector 15, a preamplifier circuit 20, an amplifier circuit 30, and so on.

In the electron microscope 1, the noise canceling aperture 12 and the noise detection circuit 40 together constitute a noise detector 4 for detecting emission noise. Also, the image detector 15, preamplifier circuit 20, amplifier circuit 30, and A/D converter 50 together constitute an image signal detector 6 for detecting an image signal (STEM image signal).

The electron microscope 1 is a scanning transmission electron microscope (STEM). Other components such as various lenses and apertures are housed in the electron optical column 10 but their description and illustration are omitted below. Some of the components of the electron microscope 1 of the present embodiment which are shown in FIG. 1 may be omitted or replaced by other parts. Also, additional components may be added to this microscope.

An electron beam emitted from the electron beam source 11 is partially cut off by the noise canceling aperture 12 and then focused onto a sample A by the lens system 13a. The focused electron beam (also referred to as an electron probe) is scanned over the sample A by the scan coils 13b. A well-known electron gun such as a cold cathode field-emission gun (CFEG) can be used as the electron beam source 11.

The electron beam transmitted through the sample A passes through the lens system 14, and a part of the beam is detected as an image signal by the image detector 15. The image signal is the product of the emission current I1 impinging on the sample A and the brightness component S of the sample A, i.e., I1×S.

The noise canceling aperture 12 detects the emission current (noise signal). By way of example, any one (such as condenser lens (CL) apertures) of the illumination apertures disposed between the electron beam source 11 and the sample A in the electron optical column 10 may be used also as the noise canceling aperture 12. A dedicated noise canceling aperture 12 apart from the illumination apertures may also be mounted.

The noise detection circuit 40 creates a signal for removing the emission noise from the image signal, based on the emission current I2 detected by the noise canceling aperture 12.

The arithmetic section 60 removes (more precisely, reduces) the noise signal superimposed on the output signal of the amplifier circuit 30 that has been converted from analog to digital form by the A/D converter 50 by making use of the fact that there is a proportional relationship between the emission current I1 impinging on the sample A and the emission current I2 detected by the noise canceling aperture 12 (i.e., I1=n×I2, where n is a proportional constant). Then, the signal free of the noise signal is arithmetically processed in a given manner by the arithmetic section 60 and then sent to the personal computer (PC) 2. An STEM image of the sample A is displayed on the display unit for use with the PC 2 and stored in it.

1.2. Signal Processing Circuitry of the Electron Microscope

Figure 2:
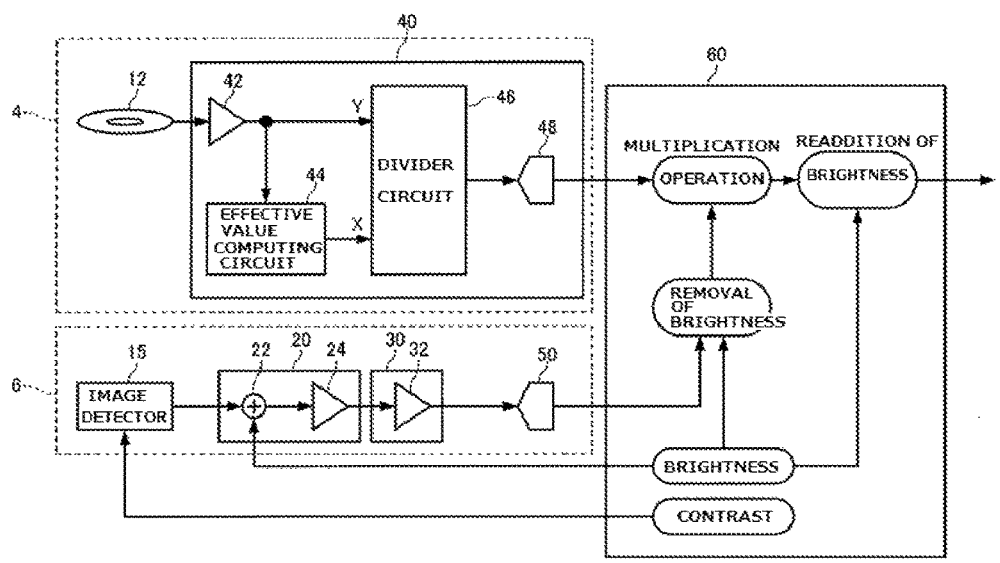
FIG. 2 is a block diagram of one specific example of signal processing circuitry included in the microscope shown in FIG. 1.

FIG. 2 shows a specific example of configuration of signal processing circuitry for use in the electron microscope according to the first embodiment. In FIG. 2, those components or configurations which are identical to their respective counterparts shown in FIG. 1 are indicated by the same reference numerals as in FIG. 1.

In the present embodiment, the image signal detector 6 is configured including the image detector 15, preamplifier circuit 20, amplifier circuit 30, and A/D converter 50. FIGS. 3A-3C show examples of signal waveform at various nodes of the image signal detector 6 of FIG. 2.

In the present embodiment, the preamplifier circuit 20 is configured including an adder 22 and an amplifier 24.

The image signal S×I1 (see FIG. 3A) obtained from the image detector 15 by adjusting the contrast is amplified by a factor of Gp by the amplifier 24 after brightness B is added by the adder 22. Therefore, the output signal of the amplifier 24 (i.e., the output signal of the preamplifier circuit 20) $V_1$ (see FIG. 3B) is given by $$V_1 = Gp \times (S \times I1 + B) \quad (1)$$

Contrast is a gain added to the image signal to adjust the degree of brightness. In the present embodiment, contrast is set for the image detector 15. Brightness is a DC voltage applied to cancel out the offset component of the image signal. In the present embodiment, brightness is set for the preamplifier circuit 20.

In the present embodiment, the amplifier circuit 30 is configured including an amplifier 32. The output signal $V_1$ of the preamplifier circuit 20 is amplified by a factor of Ga by the amplifier 32. Therefore, from Eq. (1), the output signal $V_2$ of the amplifier 32 (i.e., the output signal of the amplifier circuit 30) (see FIG. 3C) is given by $$V_2 = Ga \times Gp \times (S \times I1 + B) \quad (2)$$

The output signal $V_2$ of the amplifier circuit 30 is converted from analog to digital form by the A/D converter 50 and applied to the arithmetic section 60.

In the present embodiment, the noise detector 4 is configured including the noise canceling aperture 12 and the noise detection circuit 40. FIGS. 4A-4D show examples of signal waveform at various nodes of the noise detector 4 of FIG. 2.

The noise detection circuit 40 is configured including an amplifier 42, an effective value computing circuit 44, a divider circuit 46, and an A/D converter 48.

The amplifier 42 converts the emission current I2 (see FIG. 4A) detected by the noise canceling aperture 12 into a voltage and amplifies it by a factor of Gn. Therefore, the output signal (noise signal) $V_3$ (see FIG. 4B) of the amplifier 42 is given by $$V_3 = Gn \times I2 \quad (3)$$

The effective value computing circuit 44 calculates the effective (RMS (root mean square)) value of the output signal $V_3$ of the amplifier 42 in real time within a preset time. For example, a general-purpose IC may be used as the effective value computing circuit 44.

The output signal $(Gn \times I2)_{RMS}$ (see FIG. 4C) of the effective value computing circuit 44 is applied to the numerator input (X) of the divider circuit 46, and the output signal $V_3$ of the amplifier 42 is applied to the denominator input (Y). The divider circuit 46 performs a division of the former signal by the latter. Thus, the output signal $V_4$ (see FIG. 4D) of the divider circuit 46 is given by $$V_4 = \frac{X}{Y} = \frac{(Gn \times I2)_{RMS}}{Gn \times I2} \quad (4)$$

Figure 18:
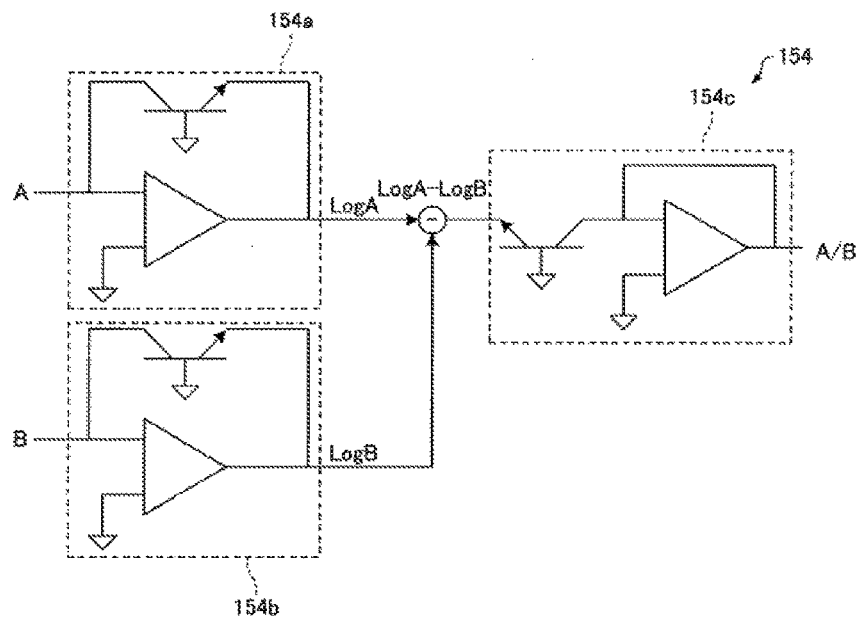
FIG. 18 is a block diagram of one example of a divider circuit using log circuits and an antilog circuit.

As one example, an analog circuit (see, for example, FIG. 18) configured including log circuits and an antilog circuit can be used as the divider circuit 46. That is, in the noise detector 4, the divider circuit 46 divides the output signal of the effective value computing circuit 44 by the output signal of the amplifier 42 in an analog manner (i.e., a division using analog signals).

The output signal $V_4$ of the divider circuit 46 is converted from analog to digital form by the A/D converter 48 and applied to the arithmetic section 60.

An offset is applied to the image signal by the preamplifier circuit 20, and the resulting signal is amplified by the amplifiers 24 and 32 to value (Gp×Ga×B). The arithmetic section 60 subtracts this value (Gp×Ga×B) from the output value of the A/D converter 50 using a digital computation. Consequently, brightness can be removed from the output value of the image signal detector 6.

The arithmetic section 60 performs a multiplication operation between the output value (Ga×Gp×S×I1) of the image signal detector 6 from which brightness has been removed and the output value $((Gn \times I2)_{RMS}/(Gn \times I2))$ of the A/D converter 48. The result of this multiplication operation is given by $$Ga \times Gp \times S \times I1 \times \frac{(Gn \times I2)_{RMS}}{Gn \times I2} = \frac{Ga \times Gp \times S \times n \times (Gn \times I2)_{RMS}}{Gn} \quad (5)$$

where I1=n×I2.

The emission currents I1 and I2 containing emission noise do not exist in the right side of Eq. (5) above. In this way, a value proportional to the brightness component S of the sample A to be imaged and observed is obtained using the noise cancellation function in the same way as when there is no emission noise.

Using a DC component $I2_{DC}$ and a noise component N, the emission current I2 is given by $$I2 = I2_{DC} + N \quad (6)$$

The output signal $(Gn \times I2)_{RMS}$ of the effective value computing circuit 44 can be approximated by $$(Gn \times I2)_{RMS} = Gn \times (I2)_{RMS} \cong Gn \times I2_{DC} \quad (7)$$

Therefore, if Eqs. (6) and (7) are substituted into Eq. (5), the result of the multiplication operation, i.e., product, is approximated by $$\frac{Ga \times Gp \times S \times n \times (Gn \times I2)_{RMS}}{Gn} \cong \frac{Ga \times Gp \times S \times n \times (Gn \times I2_{DC})}{Gn} \quad (8)$$
$$= Ga \times Gp \times S \times n \times I2_{DC}$$

In Eq. (8), $I2_{DC}$ is an ideal DC current obtained by removing noise component N from the emission current I2 and is an emission current detected when there is no emission noise. The equation, I1=I2×n, leads to the fact that $I2_{DC} \times n$ corresponds to the ideal DC current $I1_{DC}$ obtained by removing emission noise from the emission current I1.

Accordingly, if the equation, $I2_{DC} \times n = I1_{DC}$, is substituted into Eq. (8), the result of the multiplication operation performed by the arithmetic section 60 is approximated by $$Ga \times Gp \times S \times n \times I2_{DC} = Ga \times Gp \times S \times I1_{DC} \quad (9)$$

After performing the above-described multiplication operation, the arithmetic section 60 adds the previously subtracted product (Ga×Gp×B) to the result of the multiplication (see Eq. (9)) using a digital computation. Consequently, brightness is re-added. The result of the addition operation is given by $$Ga \times Gp \times S \times I1_{DC} + Ga \times Gp \times B = Ga \times Gp \times (S \times I1_{DC} + B) \quad (10)$$

The arithmetic section 60 averages or otherwise arithmetically processes the result of re-addition of brightness (see Eq. (10) above) using a digital computation to generate image data and sends the image data to the PC 2 shown in FIG. 1. The PC 2 receives the image data generated by the arithmetic section 60, writes the data into a frame buffer, displays an STEM image of the sample A, from which emission noise has been removed or reduced, on the display unit, stores the image, and performs other processing.

The value of the ideal DC current $I1_{DC}$ of Eq. (10) above is nearly equal to the emission current impinging on the sample A when there is no emission noise. Consequently, an STEM image can be observed by adjusting only two parameters, i.e., contrast and brightness, while maintaining constant Ga, Gp, Gn and the gain added to brightness that is removed and re-added.

Figure 5:
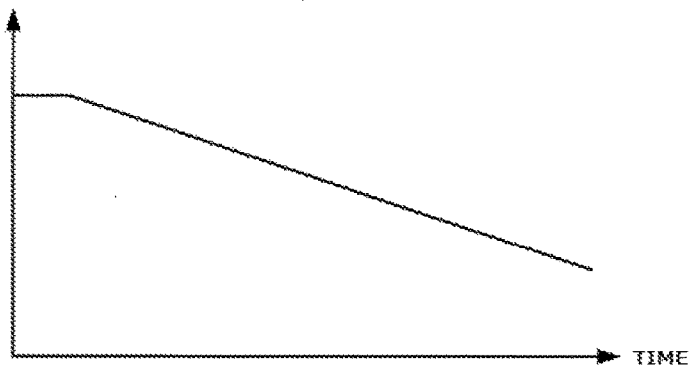
FIG. 5 is a waveform diagram showing one example of how emission current varies with time.

If the emission current decreases with time as shown in FIG. 5, the signal applied to the arithmetic section 60 always assumes the form given by Eq. (10). It is possible to continue to obtain a signal that is equal to the output signal $V_2$ of the amplifier circuit 30 (given by Eq. (2)) from which only noise has been removed.

Where the electron microscope 1 can switch on and off the noise cancellation function in an unillustrated manner, Eq. (10) representing the output signal of the arithmetic section 60 is similar to Eq. (2) representing the signal applied to the arithmetic section 60 when the noise cancellation function is deactivated except that the emission current I1 of Eq. (2) is replaced by $I1_{DC}$. Therefore, it is not necessary to perform cumbersome operations whenever the noise cancellation function is switched on or off.

The electron microscope 1 associated with the present embodiment has the following features.

In the electron microscope 1, the effective value of a noise signal is divided by the noise signal by means of the divider circuit 46 in the noise detector 4. An image signal is detected in the image signal detector 6. In the arithmetic section 60, a multiplication between the output signal of the noise detector 4 and the output signal of the image signal detector 6 is performed. Thus, the image signal does not pass through the divider circuit 46.

As an example, where an image signal passes through a divider circuit, if an analog division is used, then it is necessary to constitute log and antilog circuits having frequency bandwidths of several MHz corresponding to the speed at which the image signal is detected. This presents the problem that the noise component is increased greatly. Furthermore, if a digital division is used, this division is slower to perform than other types of arithmetic operations with the consequent result that the frequency bandwidth is narrowed.

In the electron microscope 1, as described previously, an image signal does not pass through any divider circuit. This makes it unnecessary to form a divider circuit, for example, having a frequency bandwidth of several MHz corresponding to the speed at which the image signal is detected; otherwise, noise in the divider circuit would not be suppressed. Furthermore, in the electron microscope 1, the speed of operation of the image signal detector 6 can be enhanced without being limited by the speed at which division operations are processed. Therefore, in the electron microscope 1, the foregoing problems do no occur. Hence, noise canceling which results in a low level of noise and which can be implemented at high speed can be accomplished.

Furthermore, in the electron microscope 1, the divider circuit 46 included in the noise detector 4 divides the effective value of the noise signal by the noise signal in an analog manner. As described above, the image signal does not pass through any divider circuit in the electron microscope 1 and so components making up the divider circuit 46 can be made separate from components making up the image signal detector 6. Consequently, low-noise parts having narrow frequency bandwidths can be used as the components making up the divider circuit 46. As a result, noise cancellation yielding a still lower level of noise can be accomplished.

In this way, in the electron microscope 1, the image signal detector 6 needing a bandwidth higher than several MHz and the noise detector 4 used in a frequency bandwidth up to several MHz are separated from each other by analog circuitry. As a consequence, noise cancellation which results in a low level of noise and which can be implemented at high speed can be accomplished.

In the electron microscope 1, the effective value of a noise signal is computed by the effective value computing circuit 44 and used as a dividend used in the divider circuit 46. This permits images to be observed without regard to the manner in which the emission current decreases with time as described previously. Therefore, in the electron microscope 1, if a cold cathode field-emission, electron gun (CFEG) is used as the electron beam source 11, images free from emission noise can be observed by performing operations similar to operations performed on a Schottky emission gun.

Figure 6A:
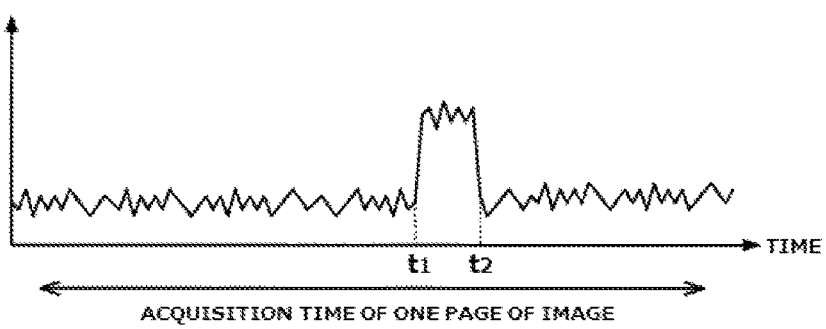
FIG. 6A is a waveform diagram of a noise signal.

As shown in FIG. 6A, the output signal (noise signal) of the amplifier 42 contains long-term emission noises (low-frequency noises) (noises appearing during an interval from $t_1$ to $t_2$ in FIG. 6A) affecting plural successive lines of image and short-term emission noises (high-frequency noises) affecting only one line. Therefore, in the effective value computing circuit 44, as the computation time to compute the effective value is reduced, the result of the computation of the effective value varies to a greater extent. As a result, the noise canceling performance will deteriorate.

Figure 6B:
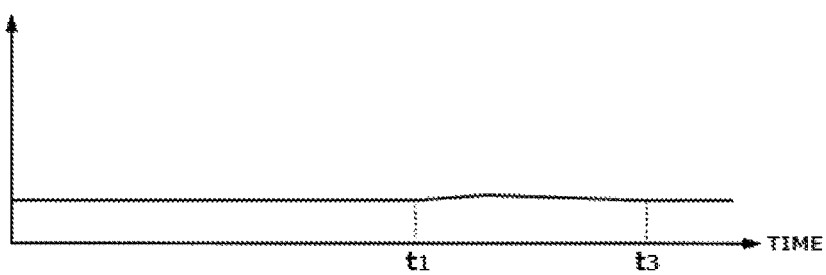
FIG. 6B is a waveform diagram of one example of the output signal of an effective value computing circuit.

The computation time taken for the effective value computing circuit 44 to compute the effective value is preferably set longer than, for example, the time (several seconds) taken for the PC 2 to obtain one page of image (STEM images) of the sample A. In this case, even if there is long-term noise, for example, persisting from $t_1$ to $t_2$ as shown in FIG. 6A, the output signal of the effective value computing circuit 44 varies only a little during the period from $t_1$ to $t_3$ as shown in FIG. 6B. In consequence, the noise canceling performance will hardly deteriorate.

1.3. Modifications of Electron Microscope

Modifications of the electron microscope associated with the present embodiment are next described. Only the differences with the above-described example of the electron microscope 1 shown in FIGS. 1 and 2 are described; a description of similarities is omitted.

(1) First Modification

Figure 7:
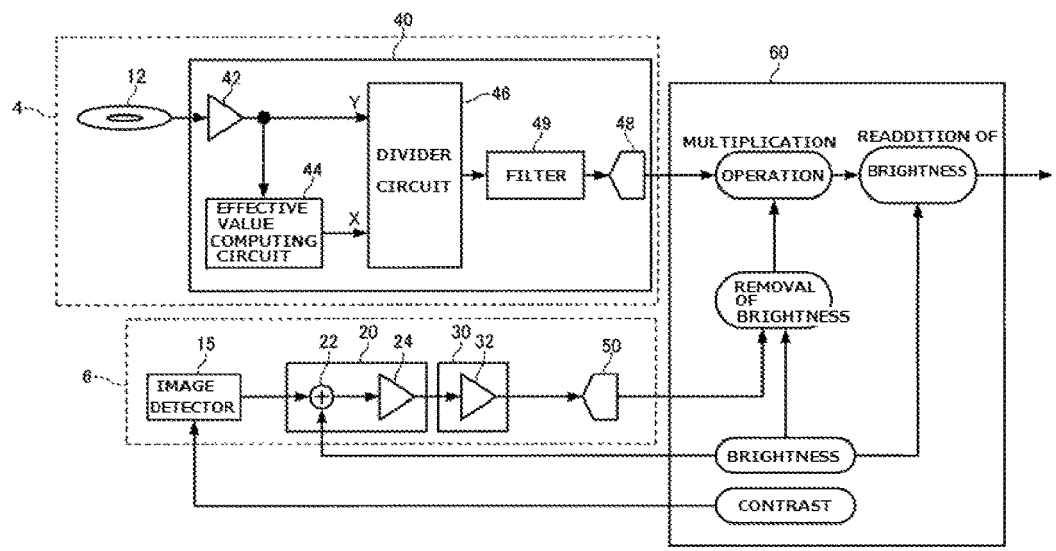
FIG. 7 is a block diagram of one specific example of signal processing circuitry according to a first modification of the first embodiment.

A first modification is first described. FIG. 7 shows a specific example of configuration of signal processing circuitry according to the first modification of the first embodiment. In FIG. 7, those configurations which are identical to their respective counterparts of FIG. 2 are indicated by the same reference numerals as in FIG. 2 and a description thereof is omitted. The electron microscope associated with the first modification is similar in configuration to the microscope shown in FIG. 1 and so its illustration and description is omitted.

The electron microscope associated with the first modification is similar to the configuration of the electron microscope 1 (see FIG. 2) associated with the first modification except that a filter 49 is inserted between the divider circuit 46 and the A/D converter 48 as shown in FIG. 7.

The filter 49 has a narrow bandwidth of several kHz and can suppress noise generated in the divider circuit 46 (e.g., including log and antilog circuits). In the same way as in the above-described first embodiment, in the electron microscope associated with the present modification, the image signal detector 6 needing a bandwidth higher than several MHz and the noise detector 4 used in a bandwidth up to several MHz are separated from each other by analog circuitry and thus the image signal does not pass through the divider circuit 46. For this reason, the filter having a narrow bandwidth for suppressing noise generated by the divider circuit 46 can be inserted. No limitation is imposed on the configuration of the filter 49. Rather, any well-known filter circuit can be used.

The electron microscope associated with the first modification can yield advantageous effects similar to those produced by the electron microscope 1 associated with the first embodiment.

Furthermore, the electron microscope associated with the first modification can achieve noise cancellation giving rise to a still lower level of noise because the filter 49 can be inserted between the divider circuit 46 and the A/D converter 48.

(2) Second Modification

Figure 8:
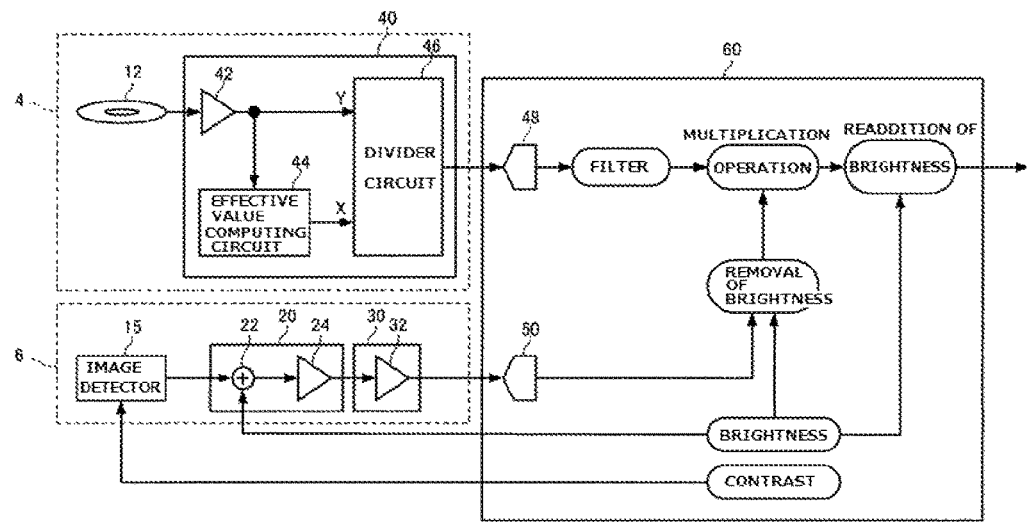
FIG. 8 is a block diagram of one specific example of signal processing circuitry according to a second modification of the first embodiment.

A second modification is next described. FIG. 8 shows a specific example of configuration of signal processing circuitry in the second modification of the first embodiment. Those configurations of FIG. 8 which are identical to their respective counterparts of FIGS. 2 and 7 are indicated by the same reference numerals as in FIGS. 2 and 7 and a description thereof is omitted. The electron microscope associated with the second modification is identical in configuration to the microscope shown in FIG. 1, and its illustration and description is omitted.

The electron microscope associated with the second modification is different from the configuration of the electron microscope 1 (see FIG. 2) associated with the first embodiment in that A/D converters 48 and 50 are incorporated in the arithmetic section 60 and that the arithmetic section 60 filters the output values of the A/D converter 48 by digital computations as shown in FIG. 8. Consequently, in the second modification, noise generated by the divider circuit 46 can be suppressed by filtering operation of the arithmetic section 60 in the same manner as the above-described filter 49 (see FIG. 7) of the first modification.

The electron microscope associated with the second modification can yield advantageous effects similar to those produced by the electron microscope associated with the first modification.

(3) Third Modification

Figure 9:
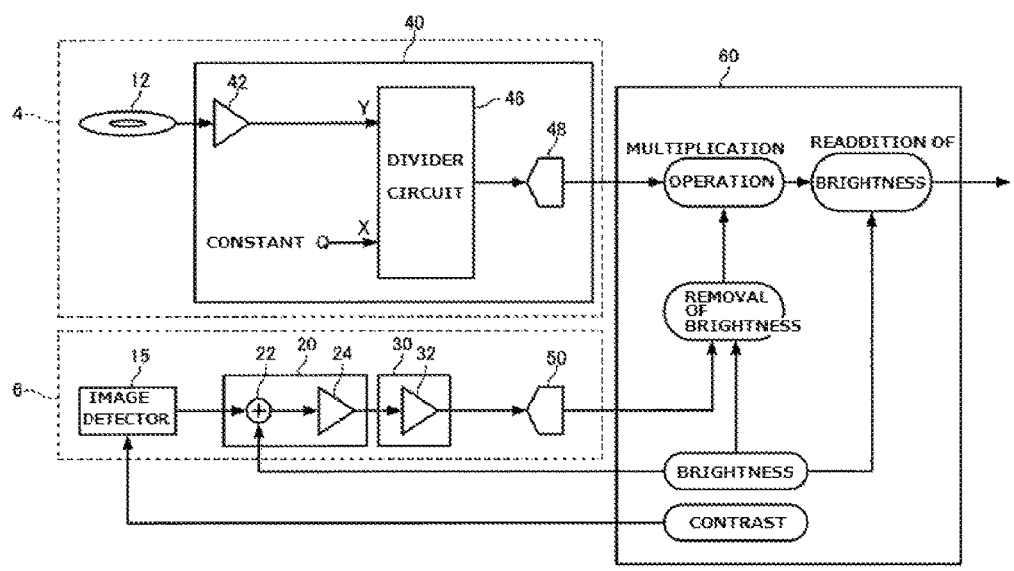
FIG. 9 is a block diagram of one specific example of signal processing circuitry according to a third modification of the first embodiment.

A third modification is next described. FIG. 9 shows a specific example of the configuration of signal processing circuitry in the third modification of the first embodiment. Those configurations of FIG. 9 which are identical to their respective counterparts of FIG. 2 are indicated by the same reference numerals as in FIG. 2 and a description thereof is omitted. The electron microscope associated with the third modification is identical in configuration to the microscope shown in FIG. 1 and thus its illustration and description is omitted.

The electron microscope associated with the third modification is similar to the configuration of the electron microscope 1 (see FIG. 2) associated with the first embodiment except that a constant Q is applied to the numerator input (X)

of the divider circuit 46 instead of the output signal of the effective value computing circuit 44 as shown in FIG. 9.

In the present modification, the noise detection circuit 40 is configured including amplifier 42, divider circuit 46, and A/D converter 48.

The constant Q is applied to the numerator input (X) of the divider circuit 46, and the output signal $V_3$ (see Eq. (3) above) of the amplifier 42 is applied, to the denominator input (Y). The divider circuit 46 performs a division of the former signal by the latter. Accordingly, the output signal $V_4$ of the divider circuit 46 is given by $$V_4 = \frac{X}{Y} = \frac{Q}{Gn \times I2} \quad (11)$$

The output signal $V_4$ of the divider circuit 46 is converted from analog to digital form by the A/D converter 48 and applied to the arithmetic section 60.

An offset is applied to the image signal by the preamplifier circuit 20, and the resulting signal is amplified by amplifiers 24 and 32 to value (Gp×Ga×B). The arithmetic section 60 subtracts this value (Gp×Ga×B), i.e., a subtrahend, from the output value of the A/D converter 50 using a digital computation. The arithmetic section 60 performs a multiplication operation between the output value (Ga×Gp×S×I1) of the image signal detector 6 from which brightness has been removed and the output value (Q/(Gn×I2)) of the A/D converter 48 using digital computations. The result of this multiplication operation is given by $$Ga \times Gp \times S \times I1 \times \frac{Q}{Gn \times I2} = \frac{Ga \times Gp \times S \times n \times Q}{Gn} \quad (12)$$

where I1=n×I2.

Note that none of the emission currents I1 and I2 containing emission noise are present in the right side of Eq. (12). Consequently, when the noise cancellation function is used, a value proportional to the brightness component S of the sample S to be imaged and observed is obtained in the same way as when there is no emission noise.

After performing the multiplication operation, the arithmetic section 60 operates to add the subtrahend (Ga×Gp×B) to the product of the multiplication (see Eq. (12) above) using a digital computation. The resulting sum is given by $$\frac{Ga \times Gp \times S \times n \times Q}{Gn} + Ga \times Gp \times B = Ga \times Gp \times \left(\frac{S \times n \times Q}{Gn} + B\right) \quad (13)$$

The arithmetic section 60 averages or otherwise arithmetically processes the sum (see Eq. (13) above) using digital computations to generate image data and sends the image data to the PC 2 shown in FIG. 1.

In the electron microscope associated with the third modification, the image signal does not pass through the divider circuit 46 in the same way as in the electron microscope 1 associated with the first embodiment and so noise cancellation which results in a low level of noise and which can be implemented at high speed can be accomplished.

2. Second Embodiment

Figure 10:
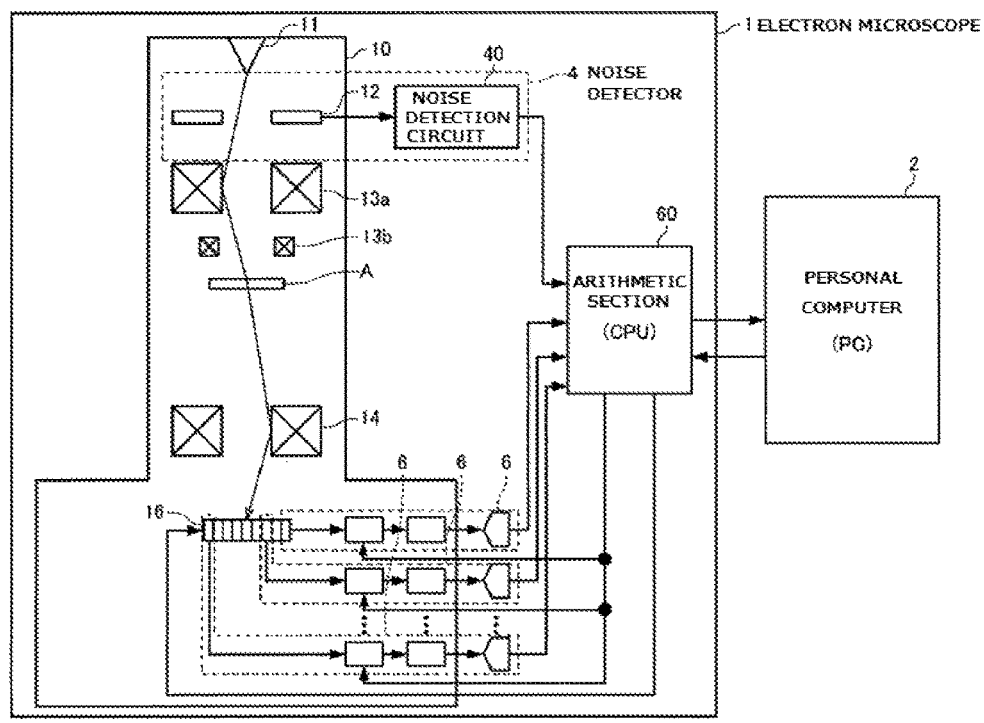
FIG. 10 is a block diagram of an electron microscope associated with a second embodiment of the present invention.

An electron microscope associated with a second embodiment of the present invention is next described by referring to FIG. 10, which shows an example of configuration of this electron microscope. Those configurations of FIG. 10 which are identical to their respective counterparts of FIG. 1 are indicated by the same reference numerals as in FIG. 1 and a description thereof is omitted.

The electron microscope 1 associated with the second embodiment differs from the electron microscope 1 associated with the first embodiment in that the image detector 15 is replaced by a multi-segmented STEM detector 16 as shown in FIG. 10.

The electron microscope 1 associated with the second embodiment has a plurality of distinct image signal detectors 6 corresponding to the detector segments of the multi-segmented STEM detector 16. Each image signal detector 6 detects only electrons impinging on a certain detector area on the sensitive surface of the multi-segmented STEM detector 16. This is equivalent to bringing the sensitive surface into coincidence with the diffraction plane in the electron microscope 1 so that electrons which are transmitted from the sample A into a certain solid angle region and scattered are detected. Therefore, the electron microscope 1 associated with the second embodiment can obtain information about the dependence of electrons scattered by the sample A on solid angle by the use of the multi-segmented STEM detector 16.

Figure 11:
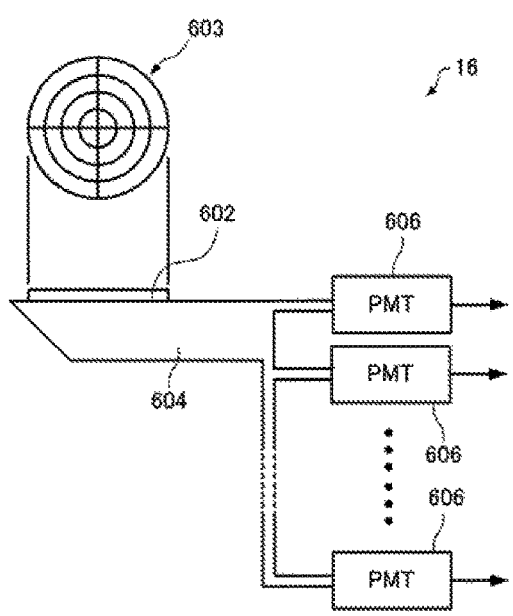
FIG. 11 is a diagram of a multi-segmented STEM detector for use in the electron microscope shown in FIG. 10.

FIG. 11 shows one example of configuration of the multi-segmented STEM detector 16. This detector 16 is configured including a scintillator 602, an optical fiber bundle 604, and photomultiplier tubes (PMTs) 606 as shown in FIG. 11.

The scintillator 602 has a sensitive surface 603 that is partitioned into a plurality of detector segments radially and in the direction of deflection. In the illustrated example, the sensitive surface 603 of the scintillator 602 has 16 detector segments. However, no limitation is placed on the number of the detector segments.

The optical fiber bundle 604 connects the detector segments of the scintillator 602 with the photomultiplier tubes 606. Optical fibers making up the optical fiber bundle 604 transmit light outgoing from the detector segments of the scintillator 602 to respective ones of the photomultiplier tubes 606.

The photomultiplier tubes 606 receive light emerging from the detector segments of the scintillator 602 via the optical fiber bundle 604. The photomultiplier tubes 606 have a 1:1 correspondence with the detector segments of the scintillator 602. The same number (16 in the illustrated example) of photomultiplier tubes 606 as the detector segments of the scintillator 602 are connected with the optical fiber bundle 604.

Figure 12:
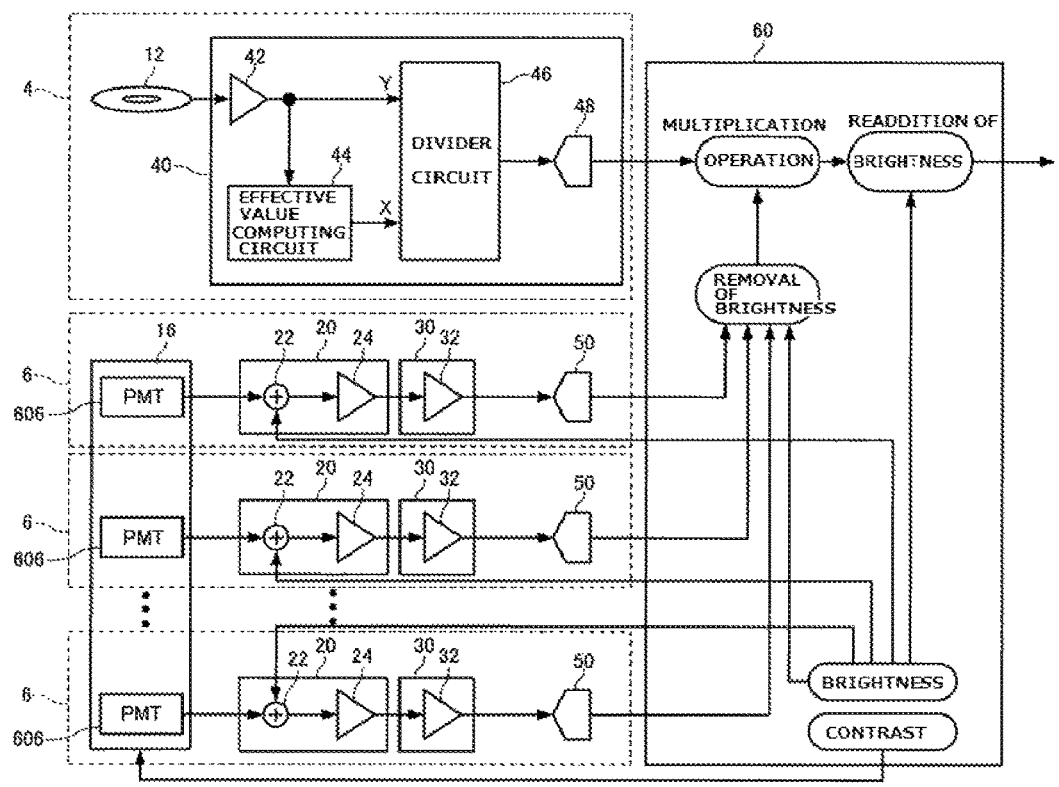
FIG. 12 is a block diagram of one specific example of signal processing circuitry included in the microscope shown in FIG. 10.

FIG. 12 shows a specific example of configuration of the signal processing circuitry according to the second embodiment. Those configurations of FIG. 12 which are identical to their respective counterparts of FIG. 2 are indicated by the same reference numerals as in FIG. 2 and a description thereof is omitted.

As shown in FIG. 12, there are as many image signal detectors 6 as the detector segments of the scintillator 602. For example, in the present embodiment, 16 image signal detectors 6 are mounted in a corresponding manner to 16 detector segments of the scintillator 602.

Each image signal detector 6 is configured including a respective one of the detector segments of the scintillator 602, optical fiber for transmitting light emitted from this detector segment, a photomultiplier tube (PMT) 606, a preamplifier circuit 20, an amplifier circuit 30, an A/D converter 50.

In the present embodiment, in each image signal detector 6, brightness B is added by an adder 22 to an image signal S×I1 obtained from the photomultiplier tube 606 for which contrast has been adjusted, and then the signal is amplified by a factor of Gp by an amplifier 24. The output signal $V_1$ (see Eq. (1) above) of the preamplifier circuit is amplified by a factor of Ga by the amplifier 32. The output signal $V_2$ (see Eq. (2) above) of the amplifier 32 is converted from analog to digital form by the A/D converter 50 and applied to the arithmetic section 60.

In the present embodiment, the output values of the A/D converters 50 are applied from the image signal detectors 6 to the arithmetic section 60. That is, in the illustrated example, the output values of the A/D converters 50 are applied from the 16 image signal detectors 6 to the arithmetic section 60.

An offset is applied to each image signal by the respective preamplifier circuit 20 and the resulting signal is amplified by the amplifiers 24 and 32 to value (Gp×Ga×B). This value (Gp×Ga×B), i.e., a subtrahend, is subtracted from the output values of the A/D converters 50 by the arithmetic section 60 using digital computations. The arithmetic section 60 performs, using a digital computation, a multiplication operation between the output value (Ga×Gp×S×I1) of the respective image signal detector 6 undergone the subtraction and the output value $((Gn \times I2)_{RMS}/(Gn \times I2))$ of the A/D converter 48. Then, the arithmetic section 60 adds the subtrahend (Ga×Gp×B) to the resulting products using digital computations. The arithmetic section 60 averages or otherwise arithmetically processes the sums (see Eq. (10) above) using digital computations to generate image data and sends the data to the PC 2 shown in FIG. 10.

In this way, in the second embodiment, the arithmetic section 60 performs the above-described arithmetic operations in parallel in response to inputting of the output values of the A/D converters 50 of the image signal detectors 6. For example, if the number of the detector segments of the scintillator 602 increases and the number of the image signal detectors 6 increases, and if the arithmetic section performs heavy duty arithmetic processing such as divisions, load may become so great that the parallel processing may not be carried out.

In the electron microscope associated with the second embodiment, a division is performed by the divider circuit 46 of the noise detector 4 and the arithmetic section 60 performs multiplication operations without performing a division operation, in the same way as in the first embodiment. Therefore, in the arithmetic section 60, load incurred in processing the arithmetic operations on the output signals of the image signal detectors 6 can be reduced, for example, as compared with the case where division operations are performed on the output signals of the image signal detectors 6. Consequently, in the electron microscope associated with the second embodiment, even if there are plural image signal detectors 6, the load on the arithmetic section 60 can be reduced. In response to inputting of the output values of the A/D converters 50 of the plural image signal detectors 6, the arithmetic section 60 can arithmetically process the output values in parallel and simultaneously.

3. Third Embodiment

Figure 13:
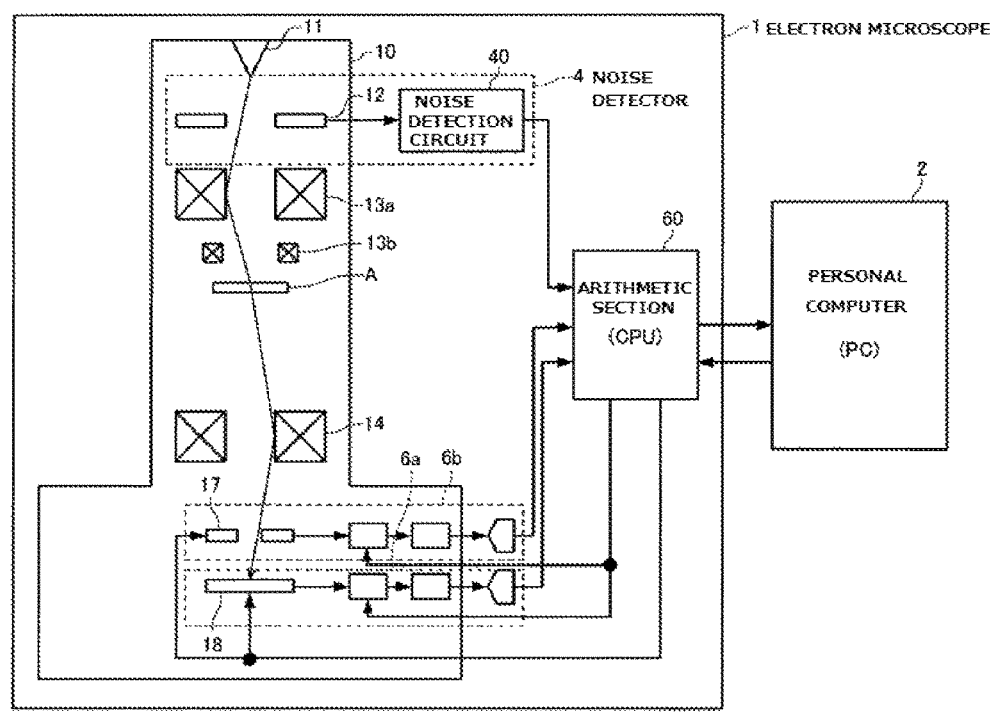
FIG. 13 is a block diagram of an electron microscope associated with a third embodiment of the invention.

An electron microscope associated with a third embodiment of the present invention is next described by referring to FIG. 13, which shows one example of configuration of this electron microscope. Those configurations of FIG. 13 which are identical with their respective counterparts of FIG. 1 are indicated by the same reference numerals as in FIG. 1 and a description thereof is omitted.

The electron microscope 1 associated with the third embodiment is similar to the electron microscope 1 associated with the first embodiment except that it has a dark-field detector 17 and a bright-field detector 18 as shown in FIG. 13.

The dark-field detector 17 has an annular scintillator, detects elastically scattered electrons scattered at large angles from the sample A, and outputs a dark-field image signal.

The bright-field detector 18 has a disk-like scintillator, detects electrons passed through a hole formed in the center of the dark-field detector 17 and scattering electrons, and outputs a bright-field image signal.

In the present embodiment, the bright-field detector 18 is disposed behind the dark-field detector 17. Therefore, in the present embodiment, the dark-field image signal and the bright-field image signal can be simultaneously accepted.

In the present embodiment, there are two independent image signal detectors 6a and 6b corresponding to the two detectors 17 and 18, respectively. Consequently, a bright-field image and a dark-field image can be observed simultaneously.

Figure 14:
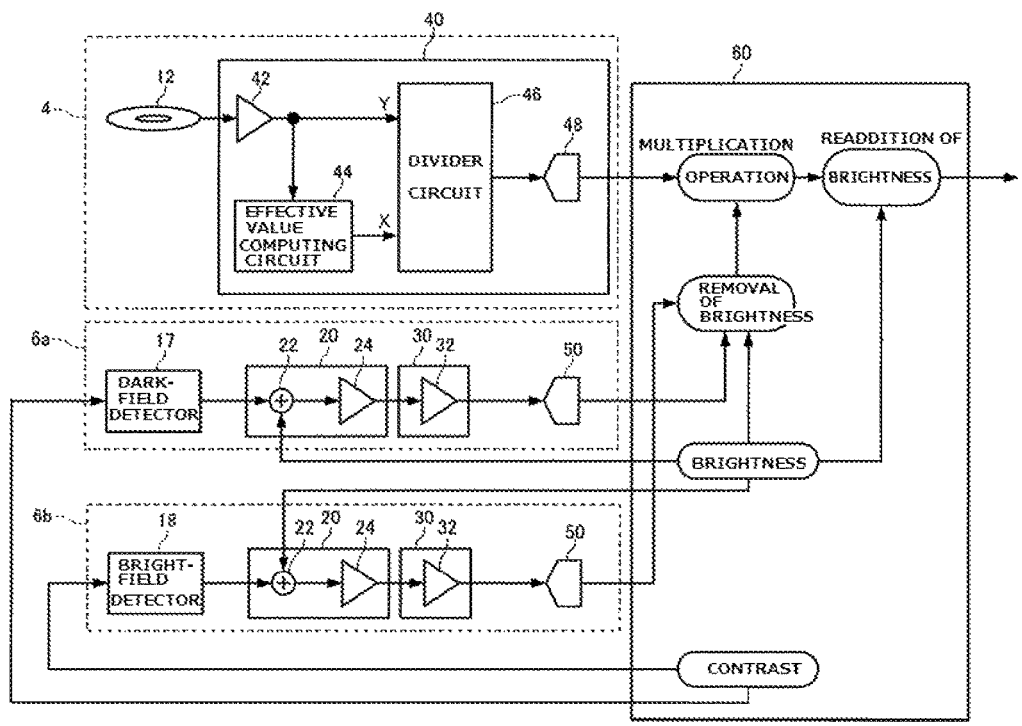
FIG. 14 is a block diagram of one specific example of signal processing circuitry included in the microscope shown in FIG. 13.
Figure 15:
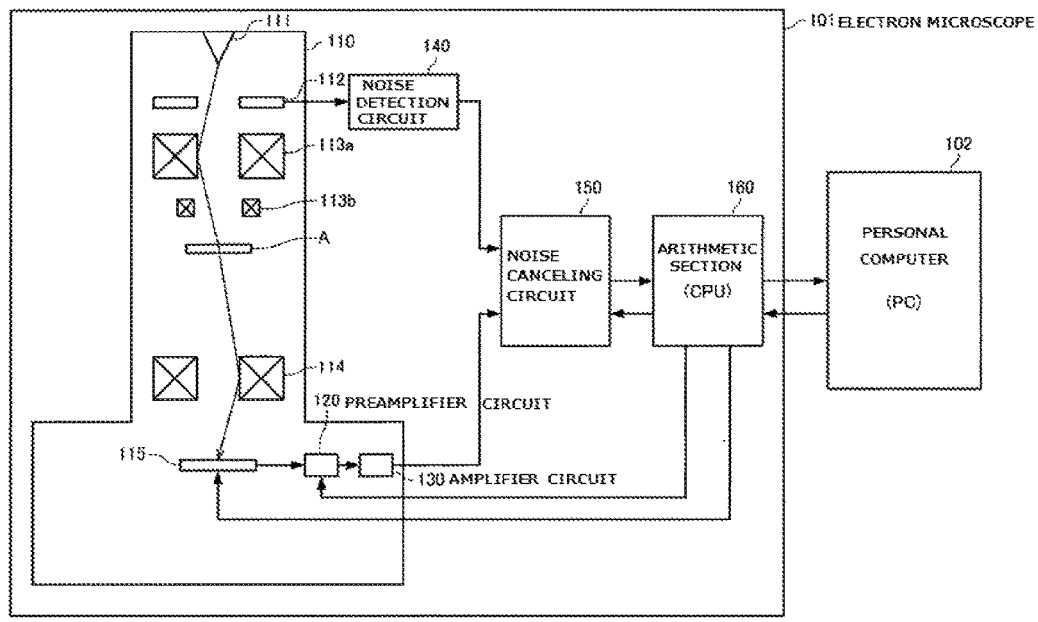
FIG. 15 is a block diagram of a scanning transmission electron microscope (STEM) having a general noise cancellation function.
Figure 16:
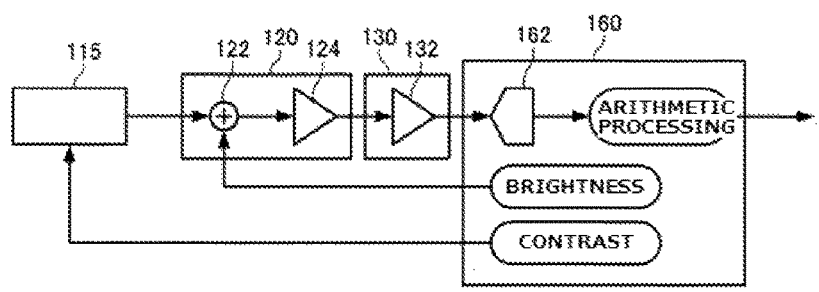
FIG. 16 is a block diagram of one specific example of signal processing circuitry incorporated in a conventional electron microscope, and in which the microscope is in a mode of operation where the noise cancellation function is not used and an illustration of electric circuitry associated with the noise cancellation is omitted.
Figure 17:
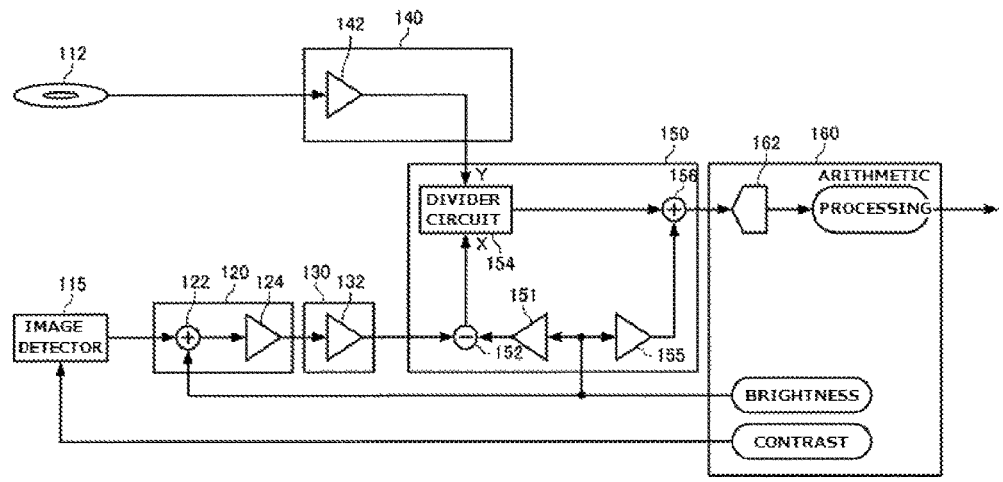
FIG. 17 is a block diagram similar to FIG. 16, but in which the microscope is in a mode of operation where the noise cancellation function is used.

FIG. 14 shows one specific example of configuration of signal processing circuitry according to the third embodiment. Those configurations of FIG. 14 which are identical to their respective counterparts of FIG. 2 are indicated by the same reference numerals as in FIG. 2 and a description thereof is omitted.

As shown in FIG. 14, the first image signal detector 6a is configured including dark-field detector 17, preamplifier circuit 20, amplifier circuit 30, and A/D converter 50.

In the first image signal detector 6a, a dark-field image signal S×I1 for which brightness has been adjusted is obtained from the dark-field detector 17. Brightness B is added to this signal by the adder 22. Then, the resulting signal is amplified by a factor of Gp by the amplifier 24. The output signal $V_1$ (see Eq. (1) above) of the preamplifier circuit is amplified by a factor of Ga by the amplifier 32. The output signal $V_2$ (see Eq. (2) above) of the amplifier 32 is converted from analog to digital form by the A/D converter 50 and applied to the arithmetic section 60.

The second image signal detector 6b is configured including bright-field detector 18, preamplifier circuit 20, amplifier circuit 30, and A/D converter 50.

In the second image signal detector 6b, a bright-field image signal S×I1 for which contrast has been adjusted is obtained from the bright-field detector 18, in the same way as in the first image signal detector 6a. Brightness B is added to this signal by the adder 22. The resulting signal is amplified by a factor of Gp by the amplifier 24. The output signal $V_1$ (see Eq. (1) above) of the preamplifier circuit is amplified by a factor of Ga by the amplifier 32. The output signal $V_2$ (see Eq. (2) above) of the amplifier 32 is converted from analog to digital form by the A/D converter 50 and impressed on the arithmetic section 60.

In the first image signal detector 6a, an offset is applied to the image signal by the preamplifier circuit 20, and the resulting signal is amplified to value (Gp×Ga×B) by the amplifiers 24 and 30. The arithmetic section 60 subtracts this value (Gp×Ga×B), i.e., a subtrahend, from the output value of the A/D converter 50 of the first image signal detector 6a, using a digital computation. The arithmetic section 60 then performs, using a digital computation, a multiplication operation between the output value (Ga×Gp×S×I1) of the first image signal detector 6a from which brightness has been removed and the output value $((Gn \times I2)_{RMS}/(Gn \times I2))$ of the A/D converter 48. Then, the arithmetic section 60 adds the subtrahend (Ga×Gp×B) to the resulting product using a digital computation. The arithmetic section 60 averages or otherwise arithmetically processes the sum (see Eq. (10) above) using a digital computation to generate image data and sends the data to the PC 2 shown in FIG. 13. The PC 2 receives the image data generated by the arithmetic section 60, displays a dark-field image of the sample A from which emission noise has been removed or reduced on a display unit, stores the image, and otherwise processes it.

The arithmetic section 60 performs the above-described processing also on the output value of the A/D converter 50 of the second image signal detector 6b. The PC 2 displays the bright-field image of the sample A whose emission noise has been removed or reduced on the display unit, stores the image, and otherwise processes it.

In the arithmetic section 60, the arithmetic operation on the output value of the A/D converter 50 of the first image signal detector 6a and the arithmetic operation on the output value of the A/D converter 50 of the second image signal detector 6b are carried out in parallel and simultaneously.

The electron microscope associated with the third embodiment can yield advantageous effects similar to those produced by the electron microscope associated with the second embodiment.

4. Other Embodiments

It is to be understood that the present invention is not restricted to the foregoing embodiments but rather can be practiced in variously modified forms without departing from the gist and scope of the present invention.

For example, in the electron microscope 1 associated with the first embodiment, as shown in FIG. 2, the output signal of the effective value computing circuit 44 is divided in an analog manner by the output signal of the amplifier 42 by means of the divider circuit 46 in the noise detector 4. In the electron microscope associated with the third modification of the first embodiment, as shown in FIG. 9, the constant Q is divided in an analog manner by the output signal of the amplifier 42 by means of the divider circuit 46 in the noise detector 4. In the electron microscope associated with the present invention, the dividend of the divider circuit 46 is not restricted to the above-described effective value of a noise signal or a constant. The dividend may be set to an average value of a noise signal or other value. Even in this case, according to the electron microscope associated with the present invention, noise cancellation which results in a low level of noise and which can be implemented at high speed can be accomplished in the same way as in the above embodiments.

Furthermore, in the above-described example of the electron microscope 1 associated with the first embodiment, analog circuitry configured including log and antilog circuits is described as the divider circuit 46 as shown in FIG. 2. In the electron microscope associated with the present invention, a general-purpose IC, for example, is used as the divider circuit 46. That is, the noise detector 4 may divide the output signal of the effective value computing circuit 44 by the output signal of the amplifier 42 using a digital arithmetic operation. Similarly, in the above-described example of the electron microscope associated with the third modification of the first embodiment, an analog circuit is used as the divider circuit 46 as shown in FIG. 9. The noise detector 4 may divide the constant Q by the output signal of the amplifier 42 using a digital arithmetic operation. Even in this case, according to the electron microscope associated with the present invention, the image signal does not undergo any division operation using a digital arithmetic operation. Hence, noise cancellation which results in a low level of noise and which can be implemented at high speed can be accomplished in the same way as in the foregoing embodiments.

In electron microscopes associated with the above-described embodiments, an offset is added to an image signal by the preamplifier circuit 20 for brightness adjustment as shown in FIG. 2 and a value equivalent to the offset is subtracted in the arithmetic section 60 prior to a multiplication, and the value which is equivalent to the offset and which was used as a subtrahend is added to the product. In the electron microscope associated with the present invention, no offset may be added in the preamplifier circuit 20. A multiplication may be performed in the arithmetic section 60. After this multiplication, i.e., after performing a noise canceling process, an offset for brightness adjustment may be added. Also, in this case, advantageous effects similar to those produced by the above embodiments can be obtained.

In the description of the above embodiments, a scanning transmission electron microscope (STEM) is taken as an example of electron microscope. The present invention can also be applied to other type of electron microscope such as a scanning electron microscope (SEM). Also, in this case, advantageous effects similar to those produced by the above embodiments can be had.

It is to be noted that the above-described embodiments and modifications are merely exemplary and that the invention is not restricted thereto. For example, such embodiments and modifications may be appropriately combined.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

Having thus described my invention with the detail and particularity required by the Patent Laws, what is desired protected by Letters Patent is set forth in the following claims.

The invention claimed is:
1. An electron microscope comprising:
an electron beam source for producing an electron beam;
a noise detector for detecting a part of the electron beam to thereby produce a beam detection signal, generating an effective value based only on the beam detection signal detected over a selected period of time, and dividing the effective value by the instant beam detection signal;
at least one image signal detector for detecting an image signal obtained by making the electron beam impinge on a sample; and
an arithmetic section for performing a multiplication between an output signal of the image signal detector and an output signal of the noise detector.

2. The electron microscope as set forth in claim 1, wherein said arithmetic section performs said multiplication by a digital arithmetic operation.

3. The electron microscope as set forth in claim 1, wherein said noise detector includes a divider circuit that divides said dividend by said beam detection signal in an analog manner.

4. The electron microscope as set forth in claim 1, wherein said effective value is the root mean square of said beam detection signal.

5. The electron microscope as set forth in claim 1, wherein said at least one image signal detector is plural in number, and wherein said arithmetic section performs multiplications between output signals of the plural image signal detectors and the output signal of said noise detector.

6. A method of operating an electron microscope, comprising the steps of:
  detecting a part of an electron beam generated by an electron beam source to thereby produce a beam detection signal, generating an effective value based only on the beam detection signal detected over a selected period of time, and dividing the effective value by the instant beam detection signal;
  making the electron beam impinge on a sample to produce an image signal and detecting the image signal; and
  performing a multiplication between an output signal produced from the image signal detecting step and an output signal produced from the electron beam detecting and dividing steps.

* * * * *